DEVICE FOR LINE SCANNING IN A TELEVISION RECEIVER USING
A SINGLE GATE SYMMETRICALLY CONDUCTING TURN-ON
TURN-OFF FIVE LAYER SEMICONDUCTOR DEVICE

Filed July 30, 1964

INVENTORS
Jean-Pierre Biet
Jean Chaupit
By Paul M. Craig, Jr.
ATTORNEY

United States Patent Office 3,381,161
Patented Apr. 30, 1968

3,381,161

DEVICE FOR LINE SCANNING IN A TELEVISION RECEIVER USING A SINGLE GATE SYMMETRICALLY CONDUCTING TURN-ON TURN-OFF FIVE LAYER SEMICONDUCTOR DEVICE

Jean-Pierre Biet, 17 bis Rue de Villebon, Saulx-les-Chartreux, France, and Jean Chaupit, 49 Ave. Gabriel Peri, Fontenay-aux-Roses, France Filed July 30, 1964, Ser. No. 386,184
Claims priority, application France, Aug. 1, 1963, 943,471
7 Claims. (Cl. 315—27)

ABSTRACT OF THE DISCLOSURE

A device for line scanning in a television receiver wherein a single gate symmetrically conducting turn-on, turn-off semi-conductor device of the triggered four-layer rectifier type, having five layers and four junctions, controlled by a multivibrator synchronized by the television receiver is connected between the deflection coil and a voltage source in control thereof.

The invention relates to a device for performing line scanning in a television receiver.

There is disclosed in U.S. Patent application Serial No. 367,470, filed May 14, 1964, now patent number 3,337,750, a symmetrically operating semi-conductor device for rendering a circuit non-conductive and conductive, said device comprising five layers and four junctions each between two semi-conductor layers of opposite conduction type, one of the layers, called the central layer, being formed by a disc-like element of semi-conductor, high-resistivity material, two other layers, called the intermediate layers, of semi-conductor material of the conduction type opposite to that of the central layer being respectively disposed on the surface of each of the two faces of said central layer, two other layers called terminal layers, of semi-conductor material of the conduction type opposite to that of the material constituting the said intermediate layers, being disposed each respectively on one part of the surface of the two intermediate layers, the said terminal layers each carrying an electrode called a terminal electrode for connection with the said circuit, the number of impurities respectively contained in each of the terminal layers and in each of the intermediate layers being such that the respective junction between one terminal layer and one intermediate layer is of the "mono-tunnel" type, the device possessing another layer, called a joining layer of semi-conductor material of the same type of conduction as the central layer, comprising a first region having a first doping level containing about $5\times10^{19}$ impurities per cm.$^3$ and extending along substantially the entire peripheral edge of the central layer, said joining layer further comprising a second region of stronger doping than said first region and containing $10^{20}$ impurities per cm.$^3$ and placed in contact with a portion of the first region that is located on a peripheral area of the first region formed on one face of the semi-conductor device, the said second region being connected to a terminal electrode to form a single control electrode for the semi-conductor device, and at least one circular groove encircling one of the terminal layers and cut almost entirely into the first region of said joining layer to electrically isolate said peripheral area and having such a depth that it reaches the central layer.

The present invention concerns the application of this device to the performance of line scanning in a television receiver.

Figures 1, 3:
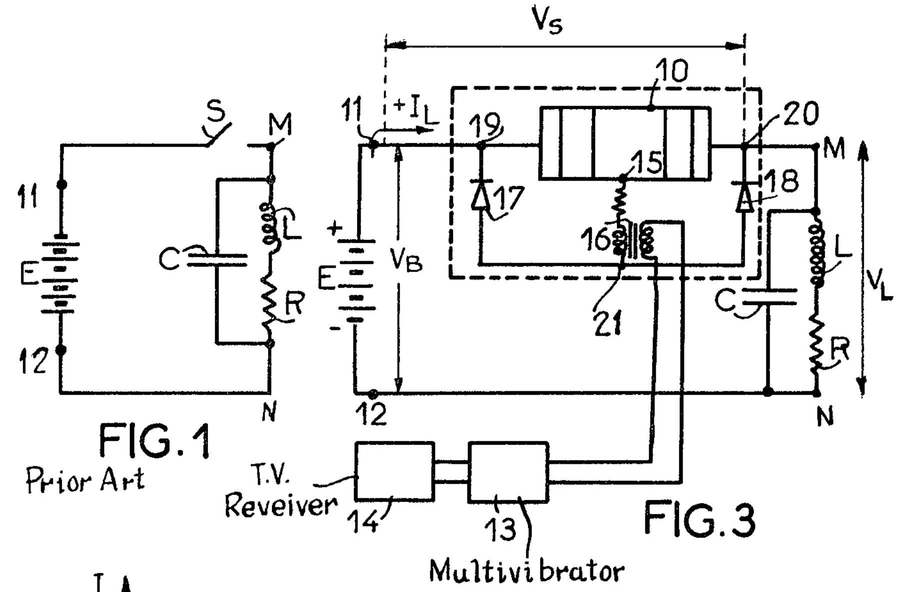
Figure 2:
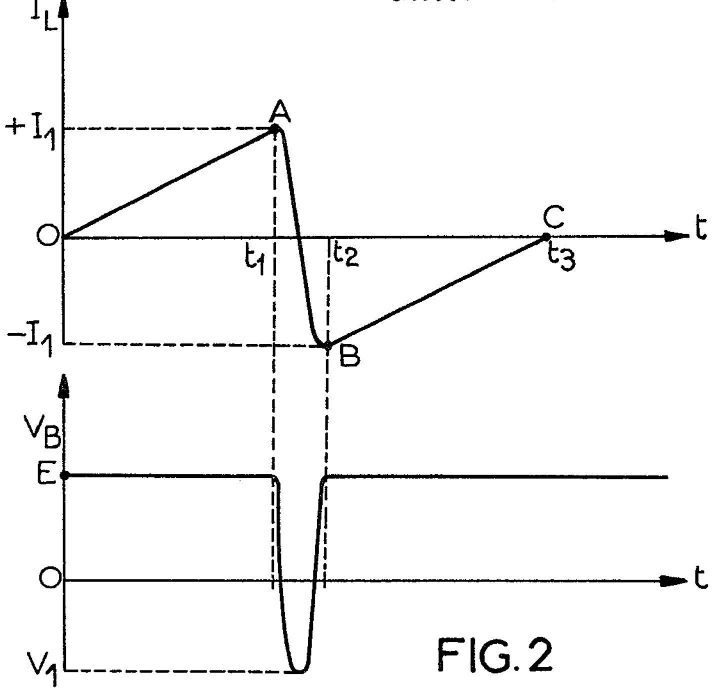

The well-known principle of the operation of a scanning device for a television receiver will first of all be recalled with reference to the accompanying FIGURES 1 and 2. In FIGURE 1, E is a unidirectional-voltage source consisting of a battery supplying current through a switch S to a coil having inductance L and resistance R, which is shunted by a capacitor C. The said coil is a coil for the deflection of the electron beam emitted by the cathode-ray tube of the said receiver. FIGURE 2 illustrates the variation, as a function of time $t$, of the current $I_L$ flowing through the coil and the voltage $V_L$ between the terminals M and N of the deflection circuit L, R, C.

At the instant 0, the switch S is closed and the current $I_L$ flowing through the coil increases from the value 0 in accordance with the law:

$$I_L=\frac{E}{R}\left(1-\exp.\left(\frac{-t}{T}\right)\right)$$

$I_L$ being the current through the coil L, E the D.C. voltage of the source, R the resistance of the deflection circuit L, R, C and T being the time constant of the circuit consisting of the coil and the resistance, i.e. $L/R$, the said time constant being so chosen that the rising portion of the curve representing the aforesaid function $I=f(t)$ may be compared to a straight line. In addition, the capacitor C is so chosen that the current flowing through it is negligible in relation to the current $I_L$. Under these conditions, the voltage at the point M is constant and equal to E.

At an instant $t_1$, the switch S is opened, and an oscillatory transient state is then set up in the circuit consisting of the coil and the capacitor. The current through the coil changes from the value $I_1$ which it possessed at the time $t_1$ to the value $-I_1$ at the time $t_2$. The voltage $V_B$ between terminals 11 and 12 of the device has the form of a half-cycle of sinusoidal function, which passes through a minimum value $-V_1$ at the instant when the current $I_L$ is cancelled out.

At the instant $t_2$, when the current $I_L$ has a value equal to $-I_1$, the switch S is closed. The current $I_L$ changes from the value $-I_1$ to $+I_1$ and becomes zero at the time $t_3$ in accordance with the aforesaid exponential law. In the interval of time between the instants $t_2$ and $t_3$, the current $I_L$ being of opposite direction to that between the initial instant and the instant $t_1$, the energy stored by the inductance is recovered by the battery E. From the instant $t_3$, the previously described cycle recommences.

It is thus apparent that the functions of the switch S are either to open the circuit composed of the battery other hand, or to be traversed by a current having a particular direction, or again to be traversed by a current of opposite direction. Since these bi-directional functions can not be performed by the known devices which utilize only one active element, i.e. electron tubes or semiconductor element, it has hitherto been necessary to employ complex arrangements comprising plural tubes or transistors and often a diode.

The advantage of such a switch is therefore, notably, that it enables currents of sawtooth form to be generated. Now, it is known that in a television receiver the currents necessary for creating the electromagnetic fields for deflecting the electron beam must have a sawtooth form. Such currents are not generally obtained directly from line and image pulses. The sweep generator has the function of converting the line and image frequency pulses into appropriate currents for the chosen mode of deflection. For example, in the case of electromagnetic deflection the currents are proportional to the time and have a form similar to that illustrated in FIGURE 2.

As has been stated in the foregoing, it is necessary with the hitherto known devices to employ a number of tubes or transistors and often at least one diode.

The invention provides a means of obviating these disadvantages, and relates to a line scanning device for a television receiver, characterised by the fact that the coil for the deflection of the electron beam by electromagnetic action, having inductance L and resistance R, and shunted by a capacitor of capacitance C, is connected to a unidirectional-voltage source through a symmetrically operating semiconductor switch which is rendering non-conductive and conductive by pulses supplied by a triggering device.

Further aspects of the invention will become apparent from the description given in the following by way of illustration, which has no limiting character, of a preferred embodiment described with reference to the accompanying drawings.

FIGURE 3 is the electric circuit diagram of the device of the invention. Connected successively in series to the terminals 11 and 12 of a direct current source consisting of, for example, a battery E, are a semiconductor element 10 and a coil for the deflection of the electron beam by electromagnetic action, which coil comprises an inductance L and a resistance R and is shunted by a capacitor C. A multivibrator 13 synchronised by pulses supplied by the television receiver 14 is connected to the control electrode 15 of the semiconductor 10 through a transformer 16. Finally, two diodes 17 and 18 are connected to the terminals of the semiconductor 10, so that their cathodes are connected respectively to the terminals 19 and 20 of the semiconductor and the common point 21 of their anodes to the secondary winding of the transformer 16.

The device operates as follows:

The multivibrator 13 supplies pulses having two voltage levels, one positive level which renders the switch conductive and maintains it in its conductive state even when the current flowing through the coil, is reduced to zero, and a negative level which renders the switch non-conductive and maintains it in the non-conductive state even when the value of the voltage applied between the terminals 11 and 12 is high.

The operating phases of the device according to the invention are identical to those previously described. When a positive pulse is applied from the multivibrator 13 on the control electrode 15 the semiconductor is rendered conductive at the instant $t=0$, the voltage E of the source is applied to the terminals of the inductance L of the deflecting coil, and a current I is set up therein. When it reaches the value $+I_1$ corresponding to the desired maximum deflection, i.e. at the time $t_1$ a negative control pulse is applied on the control electrode 15 by multivibrator 13, and the semiconductor is rendered non-conductive. Consequently, an oscillatory state is set up in the circuit LPC of frequency $f$ determined by the values of the elements of the said circuit. The voltage $V_L$ between the terminals M and N of the deflection circuit L, R, C, which was constant during the conductive period of the semiconductor, increases considerably owing to the exchange of energy between the inductance L and the capacitor C. During this time, the blocking characteristics of the device are utilised and a current $I_L$ of opposite direction flows in the coil. When, after having described a sinusoidal half-cycle, the voltage $V_L$ again reaches a potential equal to that of the source E, which happens at the time $t_2$ a positive control pulse is applied on the control electrode 15, and the semiconductor is rendered conductive. A current $I_L$ of opposite direction to the current previously flowing is set up owing to the magnetic energy stored in the coil. This energy cannot flow appreciably through the capacitor C, by reason of the high impedance presented by the latter in relation to the low impedance of the source E. The current $I_L$ flows in the coil L and the energy accumulated in the coil is recovered by the source. The circuit is again in its initial state when $I_L$ becomes zero at the time $t_3$. The current $I_L$ increases and the semiconductor retains its conductive state, so that the previously described cycle recommences.

The semiconductor element in the conductive state has low resistance, which brings about a voltage drop such that:

$$V_S = E - V_L$$

and hence $$V_L = E - V_S$$

wherein $V_S$ is the voltage drop between the terminals 19 and 20, E the direct voltage of the source and $V_L$ the voltage between the terminals of the deflection circuit L, R, C.

In addition, it has been seen in the foregoing that the energy sources are: between the instants $t_0$ and $t_1$, the voltage source E; between the instants $t_2$ and $t_3$, the inductance L of voltage $V_L$, so that we then have $$V_L = E + V_S$$

This voltage difference across the terminals of L results in a change of slope in the setting-up of the current $I_L$. In FIGURE 2, the sections OA and BC have different slopes. This is due to bad linearity in the scanning, and it is desirable to obviate it, which may be done by making the voltage drop negligible in the semiconductor for example by choosing a sufficiently high voltage ratio $E/V_L$.

Of course, various modifications may be made to the embodiment described purely by way of illustration, without departing from the scope of the present invention.

We claim:

1. A line-scanning device for a television receiver, comprising:

an electron beam deflecting coil and a capacitor forming an oscillating circuit, a direct current supply selectively connected to said oscillating circuit through a series-connected, single gate symmetrically conducting turn-on, turn-off semi-conductor device of the triggered four layer rectifier type, said semi-conductor device having five layers and four junctions, each junction being between two semi-conductor layers of opposite conduction type, one of the layers, called the central layer, being formed by a disc-like element of semi-conductor, high resistivity material, two other layers, called intermediate layers, of semi-conductor material of the conduction type opposite to that of the central layer, being respectively disposed on the surface of each of the two faces of said central layer, two other layers called terminal layers, of semi-conductor material of the conduction type opposite to that of the material constituting the said intermediate layers, being disposed each respectively on one part of the surface of said two intermediate layers, the said terminal layers each carrying an electrode called a terminal electrode for connection with the said circuit, the number of impurities respectively contained in each of the terminal layers and in each of the intermediate layers being such that the respective junction between one terminal layer and one intermediate layer is of the "mono-tunnel" type, the device possessing another layer, called a joining layer of semi-conductor material of the same type of conduction as the central layer, comprising a first region having a first doping level containing about $5 \times 10^{19}$ impurities per $cm.^3$ and extending along substantially the entire peripheral edge of the central layer, said joining layer further comprising a second region of stronger doping than said first region and containing $10^{20}$ impurities per $cm.^3$ and placed in contact with a portion of the first region that is located on a peripheral area of the first region formed on one face of the semiconductor device, the said second region being connected to a terminal electrode to form a single control electrode for the semi-conductor device, and at least one circular groove encircling one of the terminal layers and cut almost entirely into the first region of said joining layer to electrically isolate said peripheral area and having such a depth that it reaches the central layer, a sweep generator delivering control pulses at line frequency connected to said control electrode.

2. The combination defined in claim 1, wherein said sweep generator consists of a multivibrator synchronized by pulses supplied by the television receiver.

3. The combination defined in claim 2, and further including a transformer having a primary winding and a secondary winding, said multivibrator being connected to said primary winding for energizaton thereof, a first terminal of said secondary winding being connected to said control electrode.

4. The combination defined in claim 3, and further including first and second diodes connected to the respective terminals of the semi-conductor device, their cathodes being connected, respectively, to the terminals of said semi-conductor device and the common point of their anodes being connected to a second terminal of the secondary winding of said transformer.

5. A line scanning device for a television receiver, comprising:

an electron beam deflecting coil and a capacitor connected in parallel therewith forming an oscillating circuit, a direct current supply, a single gate symmetrically conducting turn-on, turn-off semi-conductor device of the triggered four layer rectifier type, said device having five layers and having first and second main terminals and a control terminal, said semi-conductor device being connected by means of said main terminals in series between said direct current supply and said oscillating circuit, and a sweep generator delivering control pulses at normal television line frequency connected to said control electrode for effecting the gate controlled blocking and unblocking of said semi-conductor device.

6. The combination defined in claim 5, wherein said sweep generator consists of a multivibrator synchronized by pulses supplied by the television receiver.

7. The combination defined in claim 5, and further including first and second diodes connected to respective main terminals of said semi-conductor device, the cathodes of the diodes being connected, respectively, to the main terminals of said semi-conductor device and the anodes of said diodes being connected together to the ocntrol terminal of said semi-conductor device.

References Cited

FOREIGN PATENTS

| | | | |
|---|---|---|---|
| 945,249 | 12/1963 | Great Britain | 317—235 |
| 1,267,417 | 6/1961 | France | 317—235 |

OTHER REFERENCES

Herzog, Lohman: Transistorized Portable Receiver, January 1955, pages 43, 44, 45.

Sziklai, Lohman, Herzog: A Study of Transistor Circuits for Television, Proceedings of the I.R.E., June 1953, pp. 712–717.

Symmetrical Properties of Transistors and Their Applications, by Sziklai, Proceedings of the I.R.E., June 1953, pp. 720, 721, 722.

ROBERT L. GRIFFIN, *Primary Examiner.*

R. K. ECKERT, *Assistant Examiner.*

UNITED STATES PATENT OFFICE

CERTIFICATE OF CORRECTION

Patent No. 3,381,161 April 30, 1968

Jean-Pierre Biet et al.

It is certified that error appears in the above identified patent and that said Letters Patent are hereby corrected as shown below:

In the heading to the printed specification, lines 6 to 8, cancel "17 bis Rue de Villebon, Saulx-les-Chartreux, France, and Jean Chaupit, 49 Ave. Gabriel Peri, Fontenay-aux-Roses, France" and insert -- Saulx-les-Chartreux, France, and Jean Chaupit, Fontenay-aux-Roses, France, assignors to Compagnie Generale D'Electricite, Paris, France, a corporation of France --.

Signed and sealed this 9th day of September 1969.

(SEAL)

Attest:

Edward M. Fletcher, Jr.

Attesting Officer

WILLIAM E. SCHUYLER, JR.

Commissioner of Patents